United States Patent
Chuang

(10) Patent No.: US 12,074,216 B2
(45) Date of Patent: Aug. 27, 2024

(54) FIN FIELD EFFECT TRANSISTOR WITH FIELD PLATING

(71) Applicant: TEXAS INSTRUMENTS INCORPORATED, Dallas, TX (US)

(72) Inventor: Ming-Yeh Chuang, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/056,962

(22) Filed: Nov. 18, 2022

(65) Prior Publication Data
US 2023/0085365 A1  Mar. 16, 2023

Related U.S. Application Data

(62) Division of application No. 16/920,903, filed on Jul. 6, 2020, now Pat. No. 11,508,842.

(51) Int. Cl.
| | |
|---|---|
| *H01L 29/78* | (2006.01) |
| *H01L 21/311* | (2006.01) |
| *H01L 21/3213* | (2006.01) |
| *H01L 21/765* | (2006.01) |
| *H01L 29/06* | (2006.01) |
| *H01L 29/10* | (2006.01) |
| *H01L 29/40* | (2006.01) |
| *H01L 29/66* | (2006.01) |

(52) U.S. Cl.
CPC .... *H01L 29/7816* (2013.01); *H01L 21/31111* (2013.01); *H01L 21/32133* (2013.01); *H01L 21/765* (2013.01); *H01L 29/063* (2013.01); *H01L 29/1095* (2013.01); *H01L 29/402* (2013.01); *H01L 29/408* (2013.01); *H01L 29/66681* (2013.01); *H01L 29/66795* (2013.01); *H01L 29/7851* (2013.01)

(58) Field of Classification Search
CPC ........ H01L 21/31111; H01L 21/32133; H01L 21/76224; H01L 21/765; H01L 29/063; H01L 29/1095; H01L 29/402; H01L 29/408; H01L 29/42368; H01L 29/66681; H01L 29/67695; H01L 29/76224; H01L 29/785; H01L 29/7816
USPC ....................................................... 257/339
See application file for complete search history.

(56) References Cited

U.S. PATENT DOCUMENTS

| | | | |
|---|---|---|---|
| 7,888,192 B2 | 2/2011 | Marshall et al. | |
| 10,096,519 B2 | 10/2018 | Shieh et al. | |
| 2010/0200915 A1* | 8/2010 | Denison | ............ H01L 29/66704 257/E29.256 |
| 2011/0306172 A1* | 12/2011 | Denison | ............ H01L 29/42368 438/270 |

(Continued)

OTHER PUBLICATIONS

International Search Report and Written Opinion dated Dec. 23, 2021, PCT Application No. PCT/IB2021/000513, 7 pages.

*Primary Examiner* — Fazli Erdem
(74) *Attorney, Agent, or Firm* — Yudong Kim; Frank D. Cimino

(57) ABSTRACT

An integrated circuit (IC) having a fin field effect transistor (FinFET) includes a substrate with a fin extending from a surface of the substrate. The fin includes a source region, a drain region, a drift region, and field plating oxide layer. The drift region is adjacent the drain region. The field plating oxide layer is on a first side, a second side, and a third side of the drift region.

18 Claims, 5 Drawing Sheets

(56) References Cited

U.S. PATENT DOCUMENTS

| | | | |
|---|---|---|---|
| 2014/0015048 A1* | 1/2014 | Ng | H01L 29/66704 |
| | | | 257/E29.256 |
| 2014/0118814 A1 | 5/2014 | Uhm et al. | |
| 2014/0151798 A1* | 6/2014 | Meiser | H01L 29/7825 |
| | | | 438/286 |
| 2014/0183629 A1* | 7/2014 | Meiser | H01L 29/7816 |
| | | | 438/286 |
| 2015/0028348 A1 | 1/2015 | Jacob et al. | |
| 2015/0035053 A1 | 2/2015 | Singh | |
| 2015/0091083 A1* | 4/2015 | Poelzl | H01L 21/283 |
| | | | 438/270 |
| 2015/0118814 A1 | 4/2015 | Ng et al. | |
| 2016/0093731 A1 | 3/2016 | Meiser et al. | |
| 2016/0308044 A1 | 10/2016 | Meiser et al. | |
| 2017/0301762 A1 | 10/2017 | Ng et al. | |
| 2018/0026133 A1 | 1/2018 | Meiser et al. | |
| 2021/0391460 A1* | 12/2021 | Chuang | H01L 29/0657 |

\* cited by examiner

FIN FIELD EFFECT TRANSISTOR WITH FIELD PLATING

CROSS-REFERENCE TO RELATED APPLICATIONS

The present application is a Division of U.S. patent application Ser. No. 16/920,903, entitled "FIN FIELD EFFECT TRANSISTOR WITH FIELD PLATING," filed on Jul. 6, 2020, which is hereby incorporated by reference in its entirety herein.

BACKGROUND

Field effect transistors (FETs) can be formed in a variety of ways to serve a variety of purposes for integrated circuits and other devices. FETs are formed as "planar" devices in some integrated circuits, i.e., as devices in which the conduction channel has width and length extending in a direction parallel to the major surface of a substrate. FETs can be formed in a silicon-on-insulator (SOI) layer of a substrate or in a bulk silicon substrate.

FETs having a non-planar conduction channel may also be fabricated. In such non-planar FETs, either the length or the width of the transistor channel is oriented in the vertical direction, that is, in a direction perpendicular to the major surface of the substrate. In one such type of device, commonly referred to as the fin field effect transistor (FinFET), the width of the conduction channel is oriented in the vertical direction, while the length of the channel is oriented parallel to the major surface of the substrate. With such orientation of the channel, FinFETs can be constructed to have a larger width conduction channel than planar FETs so as to produce larger current drive than planar FETs which occupy the same amount of integrated circuit area (the area parallel to the major surface of the substrate).

SUMMARY

Fin field effect transistors (FinFETs) that include gate field plating about three sides of a fin are disclosed herein. In one example, an integrated circuit includes a substrate having a semiconductor portion that extends from a surface of the substrate to form a fin for a FinFET. The fin includes a source region, a drain region, a drift region, and a body region between the source region and the drift region. The drift region is adjacent the drain region. A field plating oxide layer is formed on a first side, a second side, and a third side of the drift region.

In another example, a method for fabricating an integrated circuit includes forming a fin of a FinFET on a semiconductor surface of a silicon substrate. A dielectric layer is formed on the fin. The dielectric layer is etched to form a field plating oxide layer on a first side, a second side, and a third side of a drift region of the fin.

In a further example, an integrated circuit includes a substrate, a fin extending from the surface of the substrate, a field plating oxide layer, and a gate oxide layer. The fin includes a source region, a drain region, a drift region, and a body region. The drift region is adjacent the drain region. The body region is adjacent the drift region. The field plating oxide layer is on a first side, a second side, and a third side of the drift region. The gate oxide layer is on a first side, a second side, and a third side of the body region. The field plating oxide layer is thicker than the gate oxide layer.

BRIEF DESCRIPTION OF THE DRAWINGS

For a detailed description of various examples, reference will now be made to the accompanying drawings in which.

DETAILED DESCRIPTION

Gate field plating is used in planar transistors to increase drain breakdown voltage and reduce leakage current. The fin field effect transistors (FinFETs) disclosed herein include field plating formed on three sides of the fin. More specifically, the field plating is provided on three sides of a drift region of the fin. A method for fabricating the FinFET with field plating is disclosed.

Figure 1:
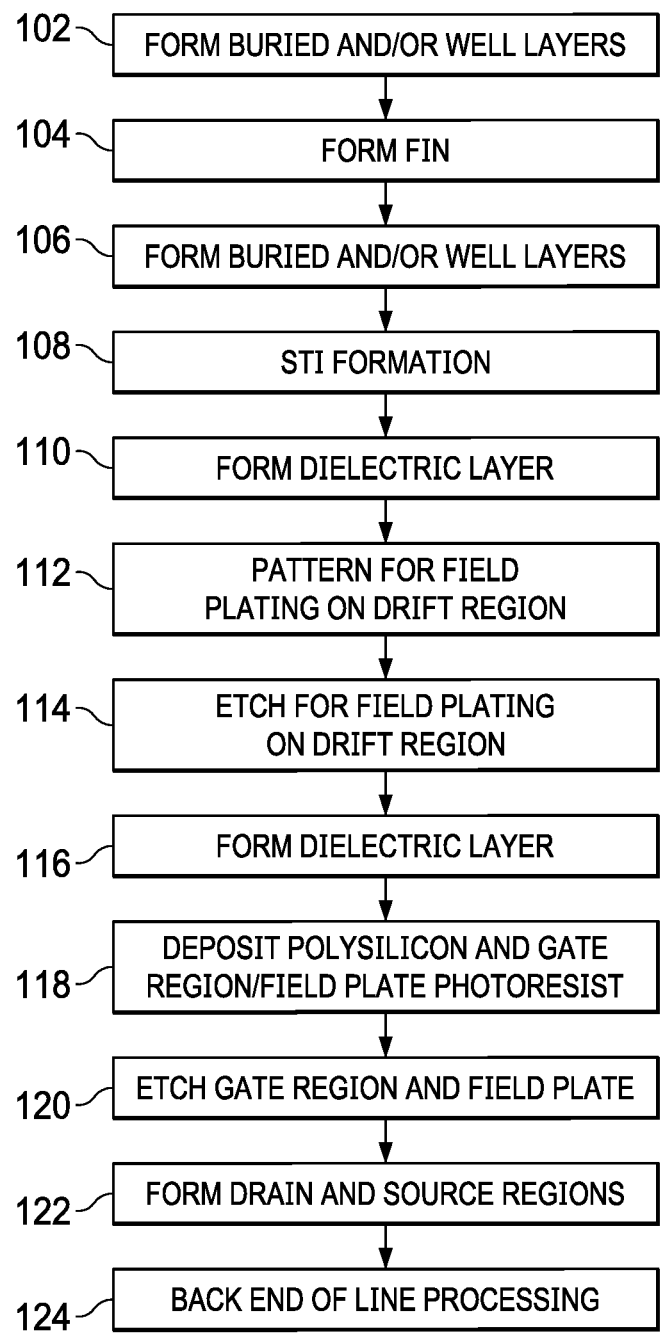
FIG. 1 shows a flow diagram for an example method for fabricating a fin field effect transistor (FinFET) that includes field plating in accordance with the present disclosure.

FIG. 1 shows a flow diagram for an example method 100 for fabricating an integrated circuit having a fin field effect transistor (FinFET) that includes field plating in accordance with the present disclosure. Though depicted sequentially as a matter of convenience, at least some of the actions shown can be performed in a different order and/or performed in parallel. Additionally, some implementations may perform only some of the actions shown.

In block 102, buried and/or well layers are formed in a substrate. The substrate may be bulk silicon, silicon on insulator (SOI), silicon-germanium, gallium arsenide, etc. In one example, a reduced surface field (RESURF) layer is formed on the oxide layer of an SOI substrate. In another example, an n-type layer is formed in a bulk silicon substrate and a RESURF layer is formed on the n-type layer.

Figure 2:
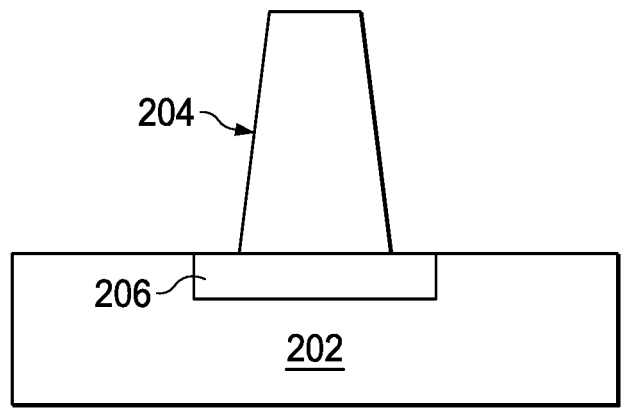
FIG. 2 shows an example fin formed on a substrate in accordance with the present disclosure.

In block 104, a fin is formed on the substrate. The fin may be formed by etching the substrate to create a fin of the substrate material. In some implementations of the method 100, an epitaxial layer (e.g., monocrystalline silicon) is grown on the substrate after buried and/or well layers are formed in block 102, and the epitaxial layer is etched to form a fin. While a single fin is referenced herein as a matter of clarity, in practice, any number of fins may be formed. FIG. 2 shows an example fin 204 formed on a substrate 202 and a RESURF layer 206 disposed below the fin 204. An example fin may have a width of about 0.15 micrometers and a height of about 0.4 micrometers.

In block 106, additional buried and/or well structures are formed. For example, impurities may be added to the silicon of the fin to adjust the threshold voltage or other parameters of the FinFET. In some implementations of the method 100, an n-type drift layer may be formed on a portion of the fin 204 to improve drain breakdown voltage in the FinFET, and/or a RESURF layer may be formed by implantation at the base of the fin 204.

Figure 3:
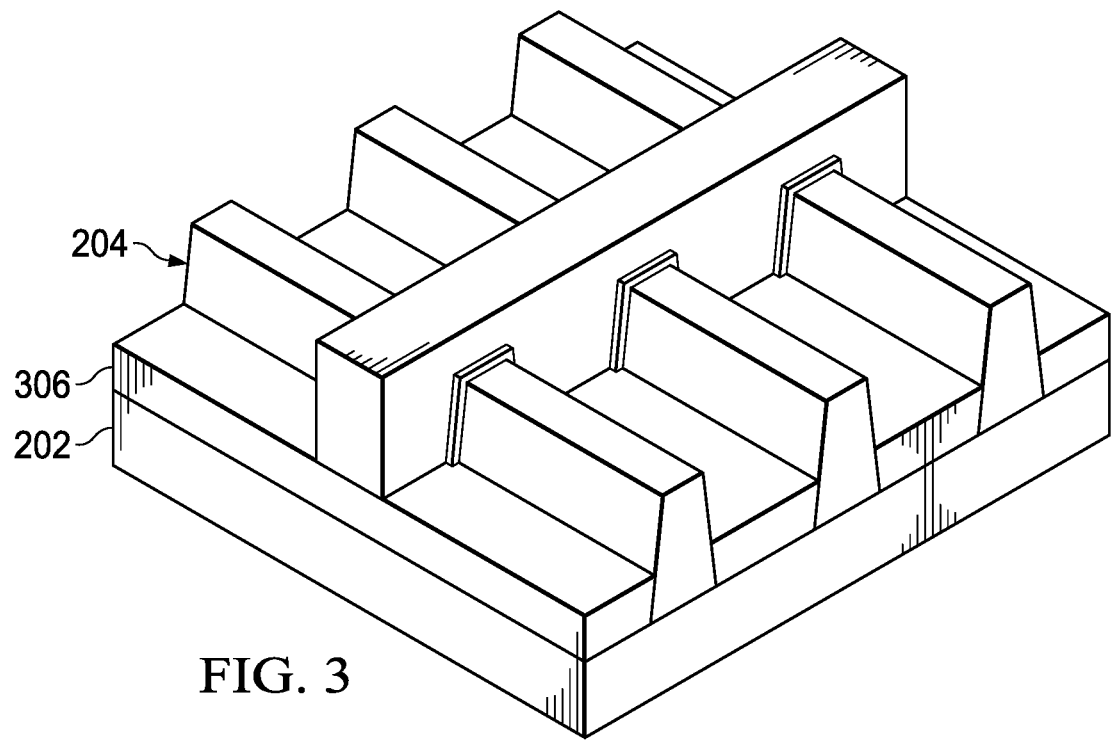
FIG. 3 shows an example of shallow trench isolation applied to the substrate about a fin in accordance with the present disclosure.

In block 108, shallow trench isolation (STI) formed on the substrate 202. The STI isolates the gate region, formed at block 122, from the substrate 202. STI formation includes depositing a dielectric material, such as silicon dioxide, on the substrate to fill a space about the fin 204, and etching the dielectric material to a desired thickness, thereby exposing a desired height of the fin 204. FIG. 3 shows STI 306 applied to the substrate 202 about the fin 204.

In block 110, a thick dielectric layer is formed on the fin 204 and the STI 306. The term "thick" is used in this instance to refer to a thickness greater than that of the subsequently formed gate dielectric layer. The thick dielectric layer may be silicon dioxide and have a thickness of about 300-1200 angstroms in some implementations. In some implementations, a layer of tetraethoxysilane (TEOS) may be deposited over the thick dielectric layer.

Figure 4:
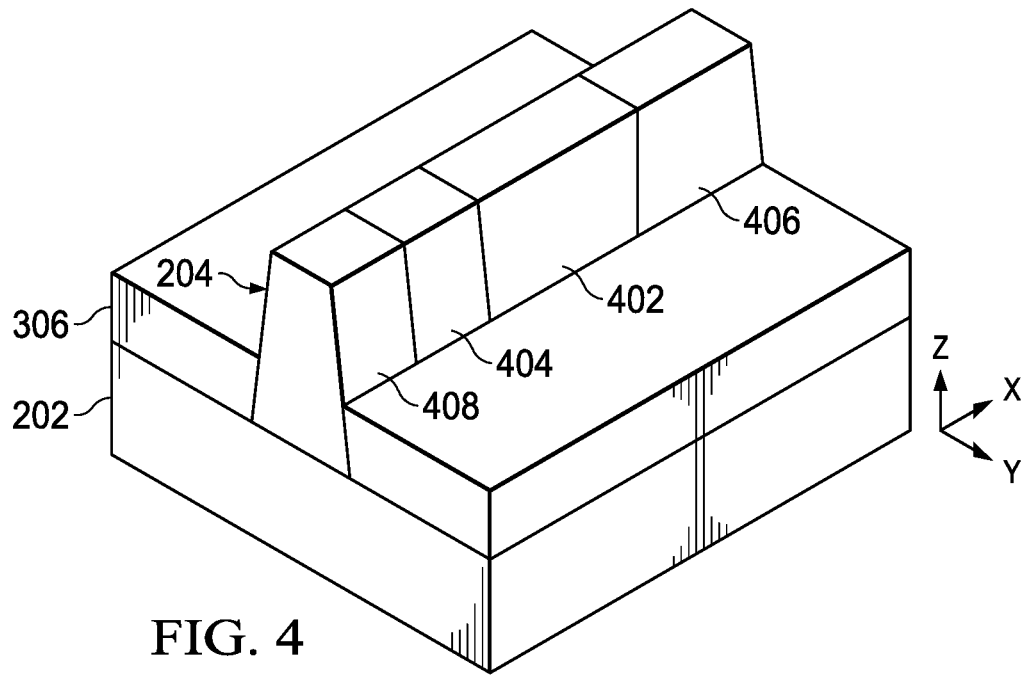
FIG. 4 shows an example drift region and body region of a fin in accordance with the present disclosure.

In block 112, a layer of photoresist material is applied over the thick dielectric layer formed in block 110. The photoresist material patterns the dielectric layer for creation of a field plating oxide on the drift region of the fin 204. FIG. 4 shows an example drift region 402 and body region 404 of the fin 204. The drift region 402 is adjacent the drain region 406 and the body region 404. The body region 404 is adjacent the source region 408 and the drift region 402.

Figure 5:
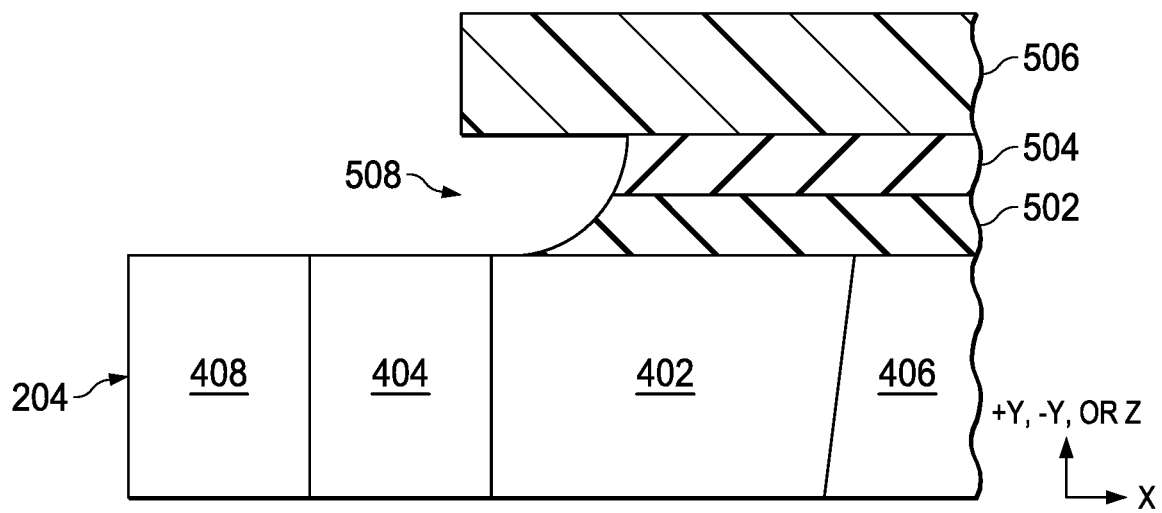
FIG. 5 shows a cross-sectional view of an example fin with a dielectric layer, a tetraethoxysilane layer, and a photoresist layer after etching and before removal of the photoresist layer.
Figure 6:
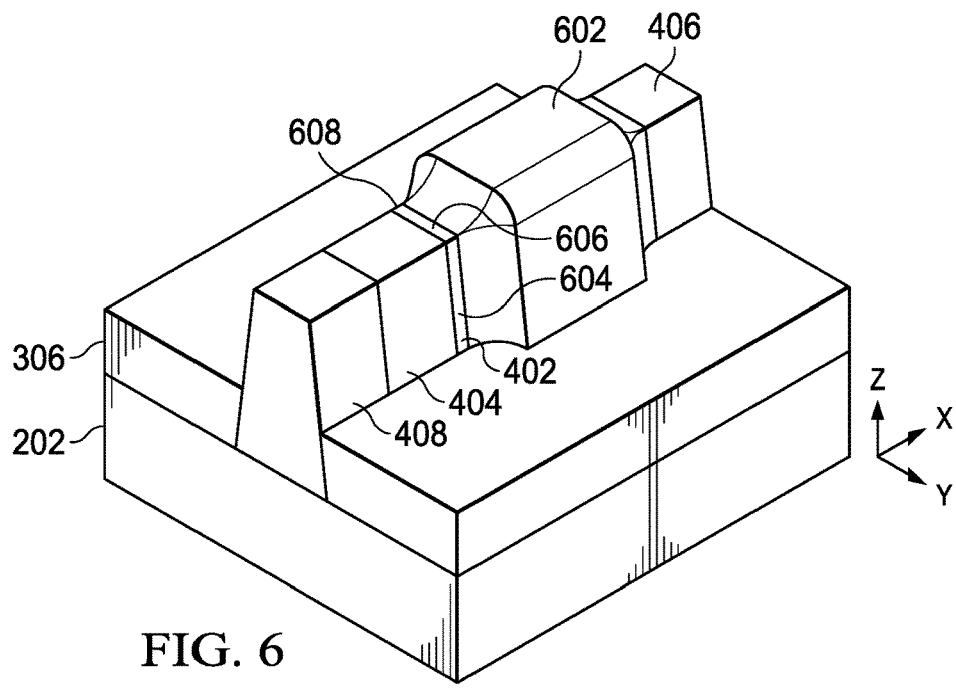
FIG. 6 shows an example of field plating formed on a drift region of a fin in accordance with the present disclosure.

In block 114, the thick dielectric layer formed in block 112 is etched to create field plating oxide (a field plating oxide layer) on the drift region 402 of the fin 204. For example, the thick dielectric layer is removed from all surfaces of the fin 204 except surfaces of the drift region 402. Wet etching may be applied to remove the thick dielectric layer. FIG. 5 shows a cross-sectional view of the thick dielectric layer 502, the TEOS layer 504, and the photoresist layer 506 on the fin 204 after etching and before removal of the photoresist layer 506. The undercut 508 produced by the etching creates a smooth corner that increases breakdown voltage, relative to a sharp corner (e.g., 90°) that increases electric field and decreases breakdown voltage. FIG. 6 shows the field plating dielectric 602 (field plating oxide layer) formed on the drift region 402 of the fin 204. The field plating dielectric 602 is formed on three sides (side 604, side 606, and side 608) of the drift region 402. Side 608 is opposite side 604.

Figure 7:
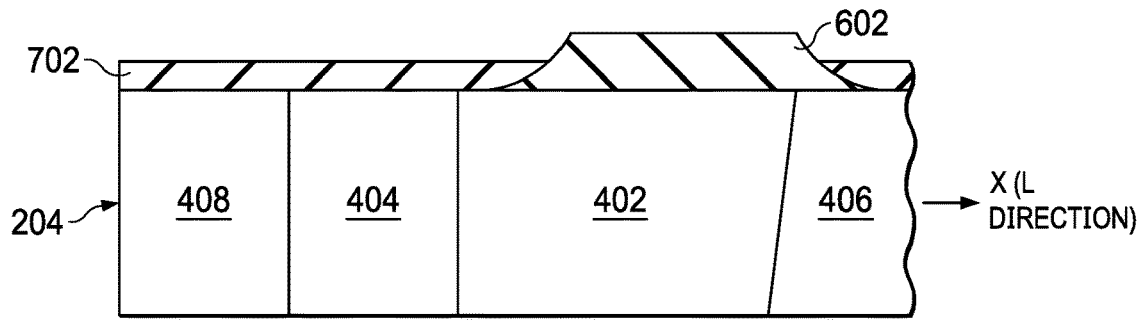
FIG. 7 shows a cross-sectional view of an example fin with gate dielectric and the field plating in accordance with the present disclosure.

In block 116, a layer of dielectric material (a gate dielectric layer) is formed on the fin 204. This layer of dielectric material may be silicon dioxide. The layer of dielectric material formed in block 110 is thicker than the layer of dielectric material formed in block 116. For example, the oxide layer formed in block 116 may be about 120 angstroms thick for a 5 volt gate oxide, and about 80 angstroms thick for a 3 volt gate oxide. FIG. 7 shows a cross-sectional view of the gate dielectric 702 and the field plating dielectric 602 formed on the fin 204. The gate dielectric 702 is adjacent to and engages the field plating dielectric 602.

Figure 8:
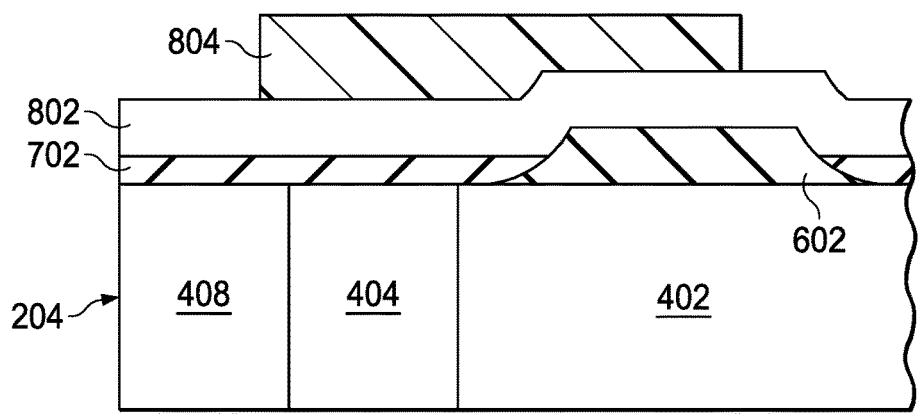
FIG. 8 shows a perspective view of an example fin with gate dielectric and field plating in accordance with the present disclosure.

In block 118, a conductive layer, such as polysilicon, is deposited on the gate dielectric 702 of the fin 204, and on at least a portion of the field plating dielectric 602 of the fin 204. A layer of photoresist material is applied over the conductive layer. The photoresist material patterns the conductive layer for creation of a gate region on the body region 404 and a field plate on a portion of drift region 402 of the fin 204. FIG. 8 shows a cross-sectional view of the conductive layer 802 and the photoresist material 804 applied to the fin 204.

Figure 9:
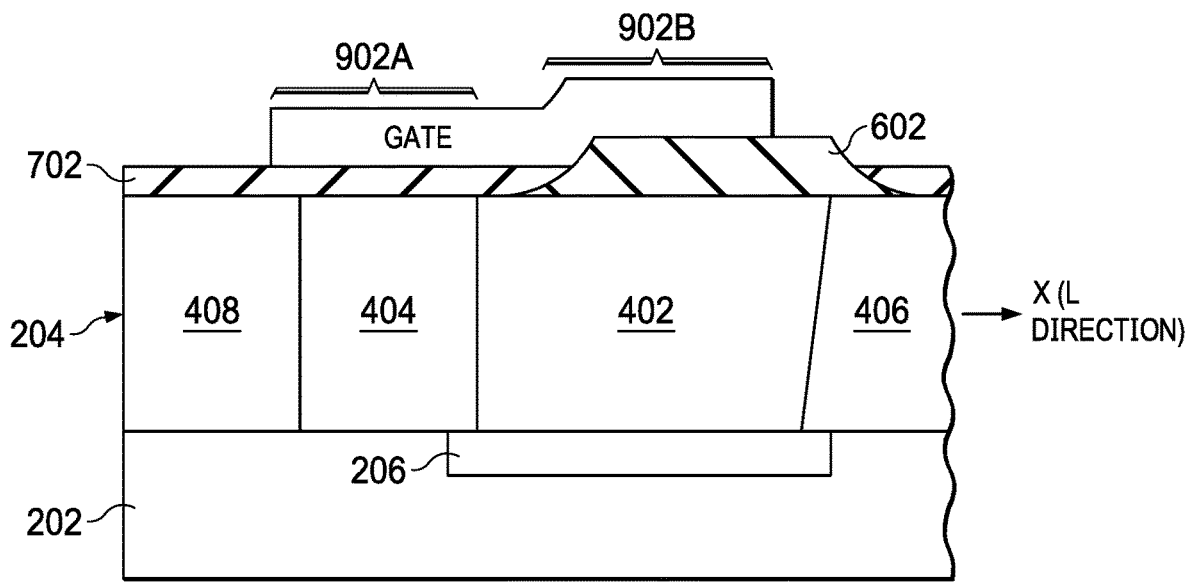
FIG. 9 shows a cross-sectional view of an example fin with a gate region formed over a gate dielectric and a portion of field plating in accordance with the present disclosure.
Figure 10:
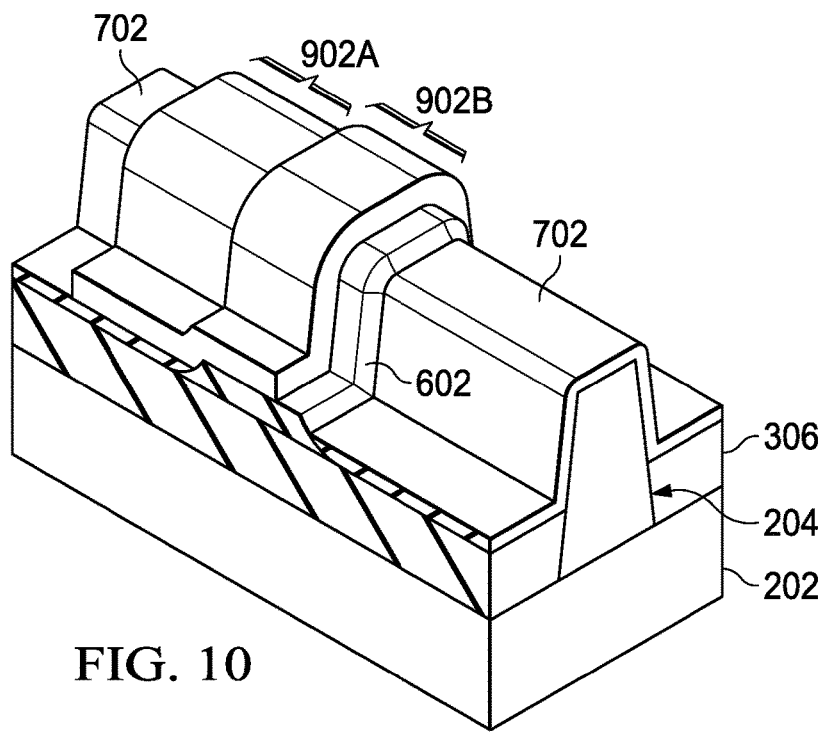
FIG. 10 shows a perspective view of an example fin with a gate region formed on three sides of the fin in accordance with the present disclosure.

In block 120, the conductive layer 802 is etched to form the gate region on the body region 404 and the field plate on a portion of drift region 402 of the fin 204. FIG. 9 shows a cross-sectional view of the gate region 902A formed on the body region 404 and the field plate 902B on a portion of drift region 402 of the fin 204 by etching the conductive layer 802. FIG. 10 shows a perspective view of the gate region 902A and the field plate 902B formed on the fin 204.

In block 122, a drain region is formed adjacent the drift region 402, and source region is formed adjacent the body region 404. For example, in a NMOS FinFET, a P-type dopant is implanted in the body region 404, and an N-type dopant is implanted in the source region 408 and the drain region 406.

In block 124, back end of line (BEOL) processing is performed. For example, metal terminals and/or routing traces are added to the source region 408, the drain region 406, and the gate region 902.

Modifications are possible in the described embodiments, and other embodiments are possible, within the scope of the claims.

What is claimed is:

1. A method, comprising:
    forming a fin on a substrate;
    forming a field plating dielectric layer on a drift region of the fin;
    forming a gate dielectric layer on a body region of the fin; and
    forming a gate on the gate dielectric layer and a field plate on the field plating dielectric layer, the gate and the field plate forming a contiguous conductive layer.

2. The method of claim 1, wherein forming the field plating dielectric layer comprises:
    forming a first dielectric layer on the fin;
    forming an etch mask covering the drift region of the fin; and
    wet etching the first dielectric layer uncovered by the etch mask to form the field plating dielectric layer, wherein an undercut under a side of the etch mask results in a smooth sidewall profile of the field plating dielectric layer.

3. The method of claim 2, wherein forming the gate dielectric layer comprises:
    forming the gate dielectric layer on the body region of the fin exposed as a result of wet etching the first dielectric layer, wherein the gate dielectric layer engages the field plating dielectric layer.

4. The method of claim 1, wherein the field plating dielectric layer is thicker than the gate dielectric layer.

5. The method of claim 1, wherein forming the gate and the field plate comprises:
    depositing the contiguous conductive layer on the field plating dielectric layer and the gate dielectric layer;
    forming an etch mask covering the body region and at least a portion of the drift region; and
    removing the contiguous conductive layer uncovered by the etch mask such that a remaining portion of the contiguous conductive layer includes the gate and the field plate.

6. The method of claim 1, further comprising:
    forming a drain region of the fin adjacent to a first side of the drift region; and forming a source region of the fin adjacent to a second side of the body region, wherein the first side of the drift region faces away from the second side of the body region.

7. The method of claim 1, further comprising:
filling a space about the fin with a dielectric material; and
etching the dielectric material to expose a portion of a first side of the fin and a portion of a second side of the fin, wherein the first side of the fin is opposite the second side of the fin.

8. The method of claim 1, further comprising:
forming a reduced surface field (RESURF) layer at a base of the fin.

9. The method of claim 1, wherein the field plating dielectric layer comprises a first dielectric layer and a second dielectric layer on the first dielectric layer.

10. The method of claim 9, wherein the second dielectric layer includes a layer of tetraethoxysilane (TEOS).

11. A method, comprising:
forming a fin of a semiconductor substrate, the fin including a drift region and a body region adjacent to the drift region;
forming a field plating oxide layer on the drift region of the fin;
forming a gate oxide layer on the body region of the fin; and
forming a gate on the gate oxide layer and a field plate on the field plating oxide layer, the gate and the field plate forming a contiguous conductive layer.

12. The method of claim 11, further comprising:
filling spaces next to the fin with a dielectric material; and
etching the dielectric material to expose a portion of a first side of the fin and a portion of a second side of the fin opposite the first side.

13. The method of claim 1, further comprising:
forming a reduced surface field (RESURF) layer at a base of the fin.

14. The method of claim 11, wherein:
the field plating oxide layer is thicker than the gate oxide layer; and
the gate oxide layer engages the field plating oxide layer.

15. The method of claim 11, wherein the field plating oxide layer includes a smooth sidewall profile.

16. The method of claim 11, wherein the field plating oxide layer comprises a first oxide layer and a second oxide layer on the first oxide layer.

17. The method of claim 11, further comprising:
forming a drain region adjacent to a first side of the drift region; and
forming a source region adjacent to a second side of the body region, wherein the first side of the drift region faces away from the second side of the body region.

18. The method of claim 11, wherein the body region is a first conductivity type and the drift region is a second conductivity type opposite the first conductivity type.

* * * * *